United States Patent [19]
Numata et al.

[11] Patent Number: 5,625,232
[45] Date of Patent: Apr. 29, 1997

[54] RELIABILITY OF METAL LEADS IN HIGH SPEED LSI SEMICONDUCTORS USING DUMMY VIAS

[75] Inventors: Ken Numata, Dallas; Kay L. Houston, Richardson, both of Tex.

[73] Assignee: Texas Instruments Incorporated, Dallas, Tex.

[21] Appl. No.: 275,570

[22] Filed: Jul. 15, 1994

[51] Int. Cl.$^6$ .............................. H01L 23/48; H01L 23/52
[52] U.S. Cl. .......................... 257/758; 257/752; 257/763; 257/774
[58] Field of Search .................................. 257/758, 763, 257/774, 752

[56] References Cited

U.S. PATENT DOCUMENTS

| | | | |
|---|---|---|---|
| 4,840,923 | 6/1989 | Flagello et al. | 437/189 |
| 4,933,743 | 6/1990 | Thomas et al. | 257/758 |
| 4,987,101 | 1/1991 | Kaanta et al. | 437/228 |
| 5,034,799 | 7/1991 | Tomita et al. | 257/758 |
| 5,103,288 | 4/1992 | Sakamoto et al. | 357/71 |
| 5,148,260 | 9/1992 | Inoue et al. | 257/758 |
| 5,324,683 | 6/1994 | Fitch et al. | 437/65 |

*Primary Examiner*—Sara W. Crane
*Assistant Examiner*—Valencia Martin Wallace
*Attorney, Agent, or Firm*—Kay Houston; James W. Brady; Richard L. Donaldson

[57] ABSTRACT

A semiconductor device (and method of manufacturing thereof) having metal leads (114+130) with improved reliability, comprising metal leads (114+130) on a substrate 112, a low-dielectric constant material (116) at least between the metal leads (114+130), and dummy vias (122+134) in contact with the metal leads (114+130). Heat from the metal leads (114+130) is transferable to the dummy vias (122+134), and the dummy vias (122+134) are capable of conducting away the heat. The low-dielectric constant material (116) may have a dielectric constant of less than about 3.5. An advantage of the invention is to improve reliability of metal leads in circuits using low-dielectric constant materials, especially in scaled-down circuits that are compact in the horizontal direction.

1 Claim, 5 Drawing Sheets

RELIABILITY OF METAL LEADS IN HIGH SPEED LSI SEMICONDUCTORS USING DUMMY VIAS

CROSS-REFERENCE TO RELATED APPLICATIONS

The following U.S. patent applications am commonly assigned and are hereby incorporated herein by reference:

| TI Case | Ser. No. | Filing Date | Inventor | Title |
| --- | --- | --- | --- | --- |
| TI-18509 | 08/137,658 | 10/15/93 | Jeng | Planarized Structure for Line-to-Line Capacitance Reduction |
| TI-18867 | 08/201,679 | 2/25/94 | Jeng et al | Selective Filling Narrow Gaps with Low-dielectric-constant materials |
| TI-18929 | 08/202,057 | 2/25/94 | Jeng | Planarized Multilevel Interconnect Scheme with Embedded Low-Dielectric-Constant Insulators |
| TI-19068 | 08/234,443 | 4/28/94 | Cho | Low Dielectric Constant Insulation in VLSI applications |
| TI-19071 | 08/234,099 | 4/27/94 | Havemann | Via Formation in Polymeric Materials |
| TI-18941 | 08/247,195 | 5/20/94 | Gnade et al | A Low Dielectric Constant Material for Electronics Applications |
| TI-19072 | 08/246,432 | 5/20/94 | Havemann et al | Interconnect Structure with an Integrated Low Density Dielectric |
| TI-19305 | 08/250,063 | 5/27/94 | Havemann et al | Multilevel Interconnect Structure with Air Gaps Formed Between Metal Leads |
| TI-19179 | 08/250,747 | 5/27/94 | Gnade et al | Low Dielectric Constant Layers via Immiscible Sol-gel Processing |
| TI-19150 | 08/250,983 | 5/31/94 | Numata | Improving Reliability of Metal Leads in High Speed LSI Semiconductors using Dummy Leads |
| TI-18895 | 08/251,822 | 5/31/94 | Numata | Improving Reliability of Metal Leads in High Speed LSI Semiconductors using Thermoconductive Dielectric Layer |
| TI-18896 | 08/250,888 | 5/31/94 | Numata | Improving Reliability of Metal Leads in High Speed LSI Semiconductors using both Dummy Leads and Thermoconductive Dielectric Layer |

FIELD OF THE INVENTION

This invention relates generally to the fabrication of semiconductor devices, and more specifically to semiconductors with submicron spacing (where the conductor width and the conductor-to-conductor spacing are both less than one micron) and low-dielectric constant materials between intermetallic leads.

BACKGROUND OF THE INVENTION

Semiconductors are widely used in integrated circuits for electronic applications, including radios and televisions. Such integrated circuits typically use multiple transistors fabricated in single crystal silicon. Many integrated circuits now contain multiple levels of metallization for interconnections.

Semiconductor devices are being scaled down in the horizontal dimension to reduce wafer cost by obtaining more chips per wafer or by increasing circuit complexity by obtaining more transistors per chip. Although semiconductor devices are being scaled down in the horizontal dimension, semiconductor devices are not generally being scaled down in the vertical dimension (because the current density would exceed reliability limits). Thus, conductors may have a high aspect ratio (ratio of conductor height to conductor width of greater than one). With horizontal scaling, these tall metal leads are being packed closer and closer together, causing capacitive coupling between the leads to become the primary limitation to circuit speed. If line-to-line capacitance is high, a likelihood for electrical inefficiencies and inaccuracies exist. Reducing the capacitance within these multi-level metallization systems will reduce the RC time constant between the lines.

Typically, the material used to isolate metal lines from each other is silicon dioxide. However, the dielectric constant of dense silicon oxide grown by thermal oxidation or chemical vapor deposition is on the order of 3.9. The dielectric constant is based on a scale where 1.0 represents the dielectric constant of a vacuum. Various materials exhibit dielectric constants from very near 1.0 to values in the hundreds.

SUMMARY OF THE INVENTION

Recently, attempts have been made to use low-dielectric constant materials to replace silicon dioxide as a dielectric material. The use of low-dielectric constant materials as insulating layers reduces the capacitance between the lines (or leads), thus reducing the RC time constant. It has been found that using materials with dielectric constants less than about 3.5 sufficiently reduces the RC time constant in typical submicron circuits. As used herein, the term low-dielectric will refer to a material with a dielectric constant of less than about 3.5.

One problem herein is that the decreased thermal conductivity of low-dielectric constant materials, especially in circuits with high aspect ratio metal leads, may result in metal lead breakage due to the effects of Joule's heat. The present invention solves this problem by improving the thermal conductivity of the structure, resulting in improved reliability of metal leads in structures using low-dielectric constant materials.

The present invention encompasses a semiconductor device structure (and method for manufacturing thereof) having metal leads with improved reliability, comprising metal leads on a substrate, a low-dielectric constant material between the metal leads, and dummy vias in contact with the metal leads. Heat from the metal leads is transferable to the dummy vias, which are capable of thermally conducting the heat away from the metal leads. The low-dielectric constant material has a dielectric constant of less than about 3.5. An advantage of the invention is improved reliability of metal leads for circuits using low-dielectric constant materials.

One preferred embodiment of a method according to the present invention involves forming metal leads on a substrate, depositing a low-dielectric constant material between the metal leads, and forming dummy vias in contact with the metal leads, so that heat from the metal leads is transferable to the dummy vias and conducted away from the leads, and where the low-dielectric constant material has a dielectric constant of less than about 3.5.

Another embodiment of a method according to the present invention comprises depositing a metal interconnect layer on a substrate, etching the metal interconnect layer in a predetermined pattern to form metal leads, depositing a low-dielectric constant material between the metal leads, depositing an insulating layer over the low-dielectric constant material and the tops of the metal leads, etching the insulating layer to leave channels in the insulating layer abutting the tops of the metal leads, and depositing a metal layer over the insulating layer to fill the channels and form dummy vias in contact with the tops of the metal leads.

Another embodiment of the invention is a semiconductor device having metal leads with improved reliability, comprising a substrate, metal leads on the substrate, a low-dielectric constant material between the metal leads, and dummy vias in contact with the metal leads, wherein heat from the metal leads is transferable to the dummy vias, and where the dummy vias are capable of conducting away the heat from the metal leads.

An advantage of the invention is improved reliability of metal leads for circuits using low-dielectric constant materials. The invention is particularly beneficial to semiconductors having a combination of metal leads with high aspect ratios and low-dielectric constant materials which are more thermally insulating.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

DETAILED DESCRIPTION OF PREFERRED EMBODIMENTS

Figures 1A, 1B, 1C:
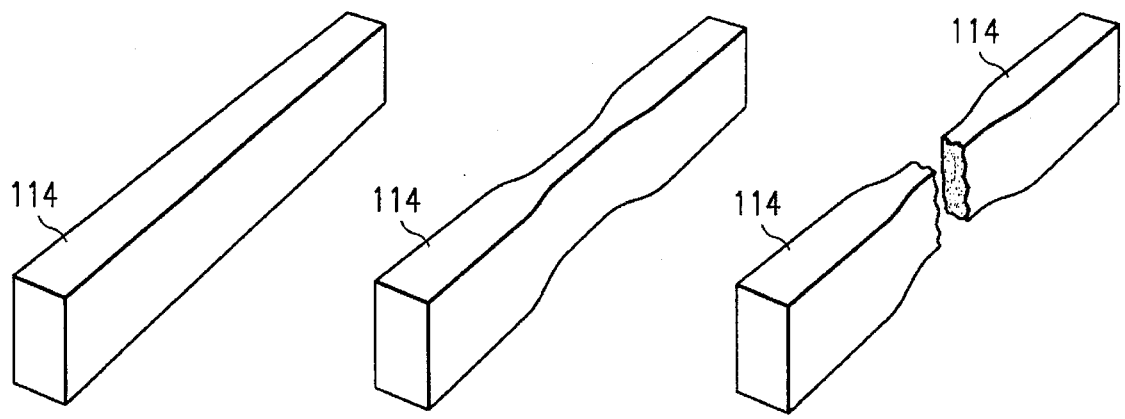
FIGS. 1A–1C are three-dimensional views of a metal lead of a semiconductor wafer, showing the negative effects of Joule's heat.

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of several embodiments of the present invention, including manufacturing methods. Corresponding numerals and symbols in the different figures refer to corresponding parts unless otherwise indicated. Table 1 below provides an overview of the elements of the embodiments and the drawings.

TABLE 1

| Drawing Element | Preferred or Specific Examples | Generic Term | Other Alternate Examples or Descriptions |
| --- | --- | --- | --- |
| 110 | | Semiconductor wafer | |

TABLE 1-continued

| Drawing Element | Preferred or Specific Examples | Generic Term | Other Alternate Examples or Descriptions |
|---|---|---|---|
| 112 | Silicon | Substrate | May be other metal interconnect layers or semiconductor elements, (e.g., transistors, diodes); Oxides; Compound semiconductors (e.g., GaAs, InP, Si/Ge, SiC). |
| 114 | Titanium trilayer (TiN/AlCu/TiN) | First metal interconnect portion of metal leads | Al, Cu, Mo, W, Ti, Si or alloys thereof; Polysilicon, silicides, nitrides, carbides; AlCu alloy with Ti or TiN underlayers; Metal interconnect layer. |
| 116 | OSOG (organic spin-on glass) | Low-dielectric constant material | Air gap (also inert gases, vacuum); silica aerogel; other aerogels or xerogels; fluorinated silicon oxide. |
| 118 | TEOS (tetraethoxysilane) silicon dioxide | Insulating layer | $SiO_2$; an insulating layer, typically an oxide and preferably having a thickness less than the height of metal leads 114 |
| 119 | Channels | Channels | Holes in insulating layer 118 where dummy vias 122 will be formed |
| 120 | Tungsten | Metal layer | Titanium trilayer (TiN/AlCu/TiN); Cu, Mo, Al, Ti, Si or alloys thereof; Polysilicon, silicides, nitrides, carbides; AlCu alloy with Ti or TiN underlayers. |
| 122 | Tungsten | Metal layer portion of dummy vias | Titanium trilayer (TiN/AlCu/TiN); Cu, Mo, Al, Ti, Si or alloys thereof; Polysilicon, silicides, nitrides, carbides; AlCu alloy with Ti or TiN underlayers. |
| 124 | Aluminum alloy | Second metal interconnect portion of functional metal leads | Titanium trilayer (TiN/AlCu/TiN or TiN/AlCu/W); Cu, Mo, W, Ti, Si or alloys thereof; Polysilicon, silicides, nitrides, carbides; AlCu alloy with Ti or TiN underlayers; Metal interconnect layer. |
| 126 | Aluminum alloy | Second Interconnect Portion of Dummy leads | Titanium trilayer (TiN/AlCu/TiN); Cu, Mo, W, Ti, Si or alloys thereof; Polysilicon, silicides, nitrides, carbides; AlCu alloy with Ti or TiN underlayers; Metal interconnect layer. |
| 128 | AlN | Thermoconductive insulating layer | $Si_3N_4$; both AlN and $Si_3N_4$ (e.g., bilayer or trilayer of $Si_3N_4$/AlN/$Si_3N_4$); Insulative material with a thermal conductivity 20% larger than the thermal conductivity of low-dielectric constant material 116 and preferably 20% larger than $SiO_2$; annealed $SiO_2$ |
| 130 | Ti | First barrier portion of metal leads | TiN or other Ti alloy; Ti/TiN bilayer; Cu, Mo, W, Al, Si or alloys thereof. |
| 132 | TEOS (tetraethoxysilane) silicon dioxide | Thin insulating layer | Other insulative material |
| 134 | Ti | Second barrier portion of dummy vias or functional metal leads | Bilayer of Ti/TiN; TiN or other Ti alloy; Cu, Mo, W, Al, Si or alloys thereof. |

An apparently heretofore-unrecognized problem in semiconductor circuits, especially circuits having high aspect ratio conductors with low-dielectric constant material between conductors, is that the decreased thermal conductivity of low-dielectric constant materials may result in metal lead breakage due to the effects of Joule's heat. Generally, as the dielectric constant of a material decreases, the conductivity of the material is also decreased. Since all metals have a certain amount of electrical resistance, metal leads with current therethrough experience heat production proportional to $I^2R$ (Joule's law). Such heat through a metal lead is known as Joule's heat. The Joule's heat will raise the metal lead's temperature if the heat is conducted away therefrom at a slower rate than it is produced.

As a metal lead heats locally in one portion along it, the resistance in that portion rises slightly (due to properties of the metal), causing the temperature in that portion to rise even more (although slightly). The higher temperature can increase lead resistance and still further increase the local heating. Thus, locally heated metal leads can be damaged or fractured. The thinner the metal lead, the weaker it is (which is particularly a concern in submicron circuits). The use of low-dielectric constant materials as insulative layers further presents a problem, for such materials generally have poor thermoconductivity. With the use of most low-dielectric constant materials, much more of the Joule's heat generated in metal leads of a circuit remains concentrated in the lead itself.

The effect of Joule's heat on a portion 114 of a metal lead is shown in FIGS. 1A–1C. FIG. 1A shows a perspective view of metal lead of a semiconductor wafer (other portions of the wafer are not shown). The cross-section of the lead is typically rectangular-shaped, with the height being greater than the width (a high aspect ratio), because of scale-down. The metal lead has been scaled down in the lateral direction, but scale-down in the vertical direction is limited by electrical conductivity requirements of the circuit. When current flows through metal lead, the metal lead is heated. In reality, a metal lead has thin and fragile portions, causing uneven lead profiles. Such unevenness cannot be avoided because photolithography and etching processes of metal leads are not ideal. Electromigration, intensified by Joule's heat, causes the metal lead to first weaken, and then thin. Thin and fragile portions of the metal lead become thinner and thinner as current is cycled through the metal lead (FIG. 1B), and electromigration is even further intensified in this portion. Eventually such leads can break, as shown in FIG. 1C, resulting in device failures.

Figures 2A, 2B, 2C, 2D:
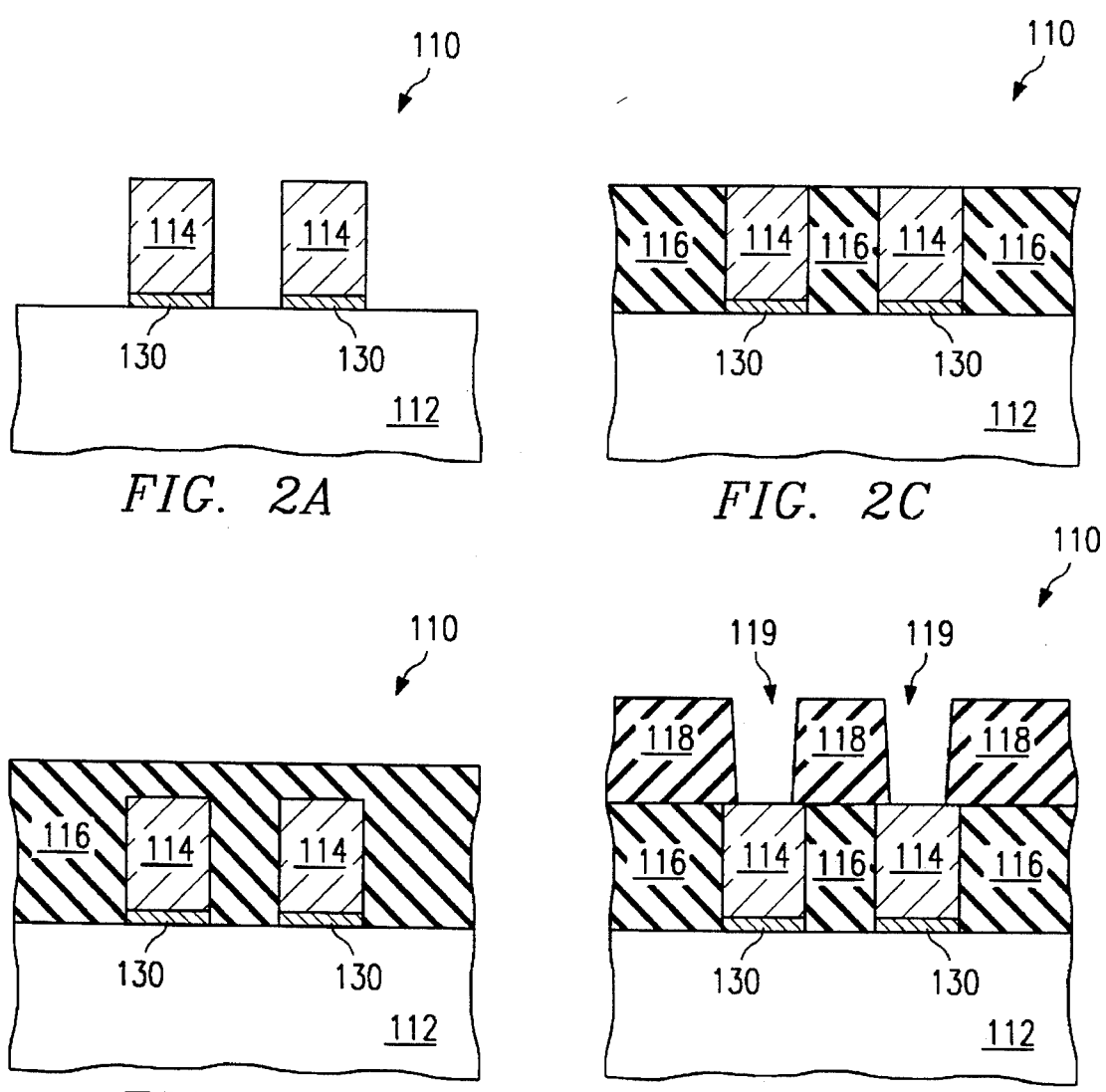
FIGS. 2A–2D and 3A–3C are cross-sectional elevational views of a first embodiment of the present invention, showing dummy vias formed in contact with metal leads on a semiconductor wafer to thereby avoid the negative effects of Joule's heat as depicted in FIG. 1.

The present invention improves reliability of metal leads in structures using low-dielectric constant materials by using dummy vias in contact with metal leads to improve the thermal conductivity of the structure. FIG. 2A shows a cross-sectional view of a semiconductor wafer 110 having metal leads 114+130 formed on a substrate 112. The substrate may, for example, contain transistors, diodes, and other semiconductor elements (not shown) as are well known in the art. The substrate 112 may also contain other metal interconnect layers, and typically contains a top insulating oxide layer (to prevent leads from shorting to each other in subsequent metal layers). A first barrier layer is deposited over the substrate 112. The first barrier layer is preferably comprised of titanium. A first metal interconnect layer is deposited over the first barrier layer. The first metal interconnect layer is preferably comprised of a TiN/AlCu/TiN trilayer, but may also comprise, for example, other aluminum alloy multilayers or monolayers. The first metal interconnect layer and first barrier layer are etched with a predetermined pattern to form etch lines, or metal leads 114+130 (FIG. 2A). Each metal lead 114+130 includes a first metal interconnect portion 114 and a first barrier portion 130. Some of the metal leads 114+130 may be in close proximity to each other, for example, 1 μm or less apart. The aspect ratio (height/width) of the metal leads is generally at least 1.5, but typically at least 2.0, and more typically at least 3.0.

Low-dielectric constant material 116 is deposited over the metal leads 114+130 and substrate 112 (FIG. 2B). The low-dielectric constant material 116 is preferably comprised of an OSOG (organic spin-on glass), but may also be comprised of an aerogel, xerogel, or other low-dielectric constant materials which provide a dielectric constant of less than about 3.5, but preferably less than 3.0, and more preferably less than 2.5. The OSOG provides a dielectric constant of about 3.0, and is typically spun on by a spin-coater and then cured for half an hour to 2 hours at a temperature of 400° C.–450° C. The low-dielectric constant material 116 is then removed (e.g., with a timed etch) from at least the tops of metal leads 114+130 (FIG. 2C). An insulating layer 118 (preferably TEOS silicon dioxide) is applied over the exposed tops of metal leads 114+130 and low-dielectric constant material 116. Next, the insulating layer 118 may be planarized, if needed. The insulating layer 118 is patterned (for example, a resist, not shown, may be deposited, exposed, and removed) and etched to leave channels 119 where dummy vias 122+134 will later be formed (FIG. 2D). Channels for functional vias (not shown) are preferably formed at the same time the channels 119 for dummy vias 122+134 are formed. The channels 119 expose at least the tops of metal leads 114+130 through insulating layer 118.

Figure 3A:
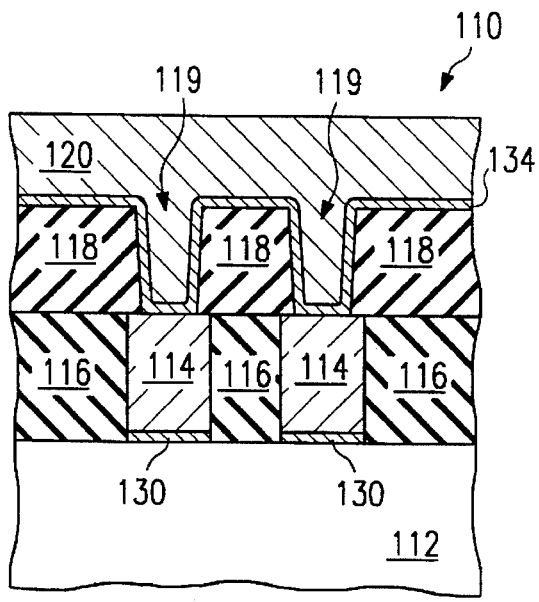
Figure 3B:
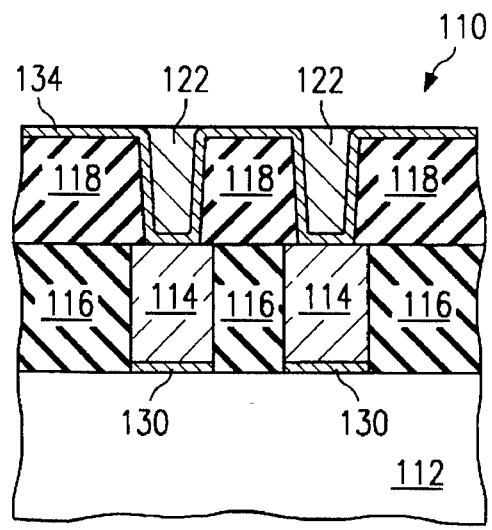
Figure 3C:
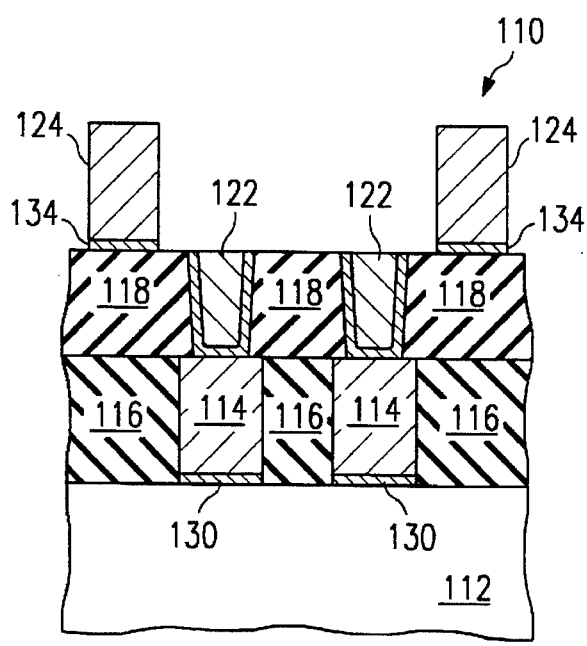

Second barrier layer 134 may be deposited over the tops of metal leads 114+130 and insulating layer 118 (FIG. 3A). Second barrier layer 134 is preferably titanium but may also be a bilayer of Ti/TiN or other metal alloys. Metal layer 120 is deposited over second barrier layer 134. The metal layer 120 is preferably tungsten and may be deposited with a CVD process, but other metal alloys may be used. The metal layer 120 may then be removed from the second barrier layer 134, leaving in the channels 119 portions 122 thereof. Thus, dummy vias 122+134 reside in the channels 119 in contact with metal leads 114+130 (FIG. 3B). Each dummy via 122+134 includes a metal layer portion 122 and a second barrier portion 134. Since dummy vias 122+134 are comprised of metal, they are excellent thermal conductors. The metal-to-metal contact between the dummy vias 122+134 and the metal leads 114+130 provides an excellent path for thermoconduction. The dummy vias 122+134 conduct away enough of the Joule's heat from, and prevent damage to, the metal leads 114+130 when the device is in operation. Subsequent processing steps may then be performed, e.g., further deposition and etching of semiconductor, insulative and metallic layers. A possible subsequent processing step is shown in FIG. 3C, where functional metal leads 124+134 are formed in a second metal interconnect layer. The functional metal leads 124+134 are comprised of a second barrier portion 134 and a second metal interconnect portion 124.

Figure 4:
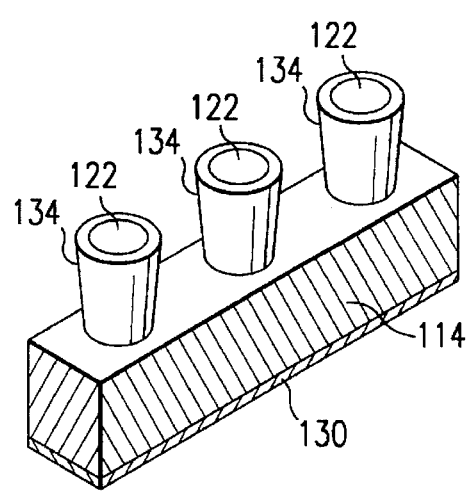
FIG. 4 is a perspective view of a first embodiment of the invention generally illustrated in FIG. 3B.

A perspective view of the first embodiment is shown in FIG. 4. Preferably, a metal lead 114+130 will have several dummy vias 122+134 formed along its length. The more dummy vias 122+134 there are along the metal lead, the more Joule's heat is conducted away from the metal lead 114+130. For example, in a submicron circuit, dummy vias 122+134 formed every 4 μm along the length of a metal lead 114+130 effectively conducts heat away from the metal lead 114+130.

Figure 5:
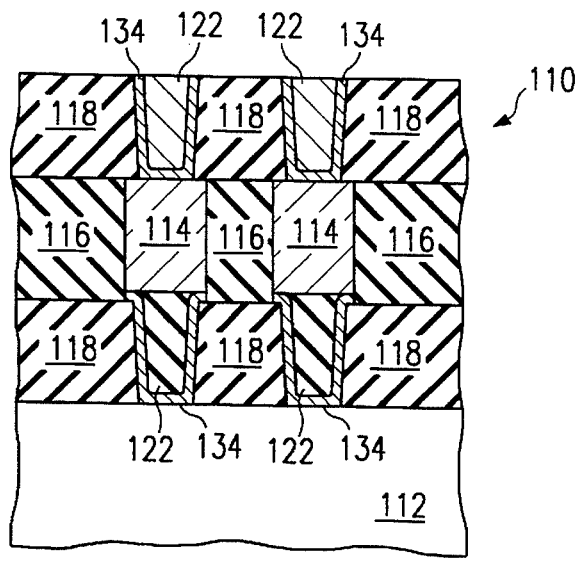
FIG. 5 is a cross-sectional elevational view of a second embodiment of the present invention, with dummy vias in contact with both the top and bottom of metal leads.
Figure 6:
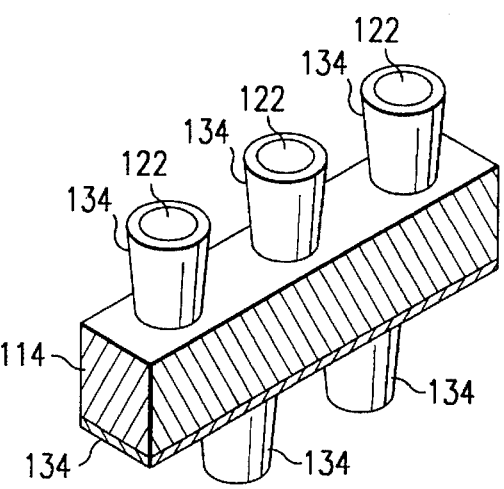
FIG. 6 is a perspective view of the second embodiment, generally illustrated in FIG. 5.

A second embodiment of the present invention is shown in a cross-sectional elevational view in FIG. 5. In this embodiment, dummy vias 122+134 are formed in contact with both the tops and bottoms of metal leads 114. An advantage of the second embodiment is the ability to conduct away more Joule's heat due to the increase of thermoconductive metal (provided by the dummy vias 122+134) in contact with metal leads 114. A perspective view of the second embodiment is shown in FIG. 6. Dummy vias 122+134 may also be formed only on the bottom of the metal leads 114, although preferably not on the first metal layer, to avoid damage to transistors and other devices on the underlying circuit.

Figure 7:
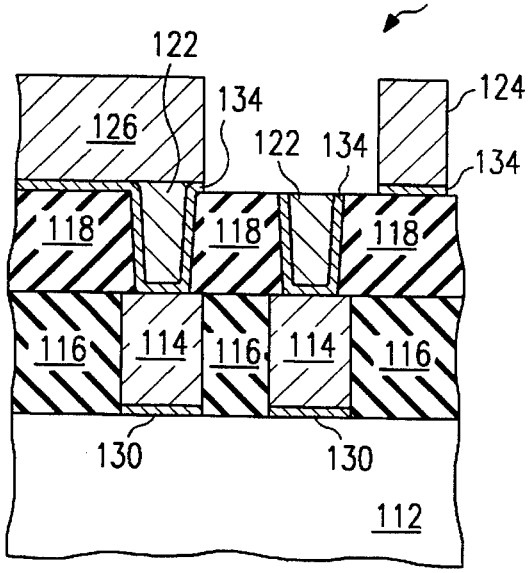
FIG. 7 is a cross-sectional elevational view of a third embodiment of the present invention, showing dummy vias formed in contact with metal leads on a semiconductor wafer, where the dummy vias are also in contact with dummy leads in another metal layer.

A third embodiment is shown in FIG. 7. After the step shown in FIG. 3B, a second metal interconnect layer is deposited. Dummy leads 126+134 are formed in the second metal interconnect layer, in contact with the dummy vias 122+134. The dummy leads 126+134 are comprised of a second barrier portion 134 and a second metal interconnect portion 126. This structure provides more metal (from the dummy vias 122+134 and the dummy leads 126+134) to conduct away more heat from the metal lead 114+130. Joule's heat migrates from metal leads 114+130 to dummy vias 122+134 and through dummy vias 122+134 to dummy leads 126+134. Joule's heat is conducted away from the metal leads 114+130 by both the dummy vias 122+134 and dummy leads 126+134. (See also U.S. patent application Ser. No. 08/250,983, filed on May 31, 1994 by Numata and assigned to Texas Instruments, where dummy leads are formed proximate metal leads). Functional metal leads 124+134 may be formed at the same time dummy leads 126+134 are formed. The functional metal leads 124+134 are comprised of a second barrier portion 134 and a second metal interconnect portion 124.

Figure 8:
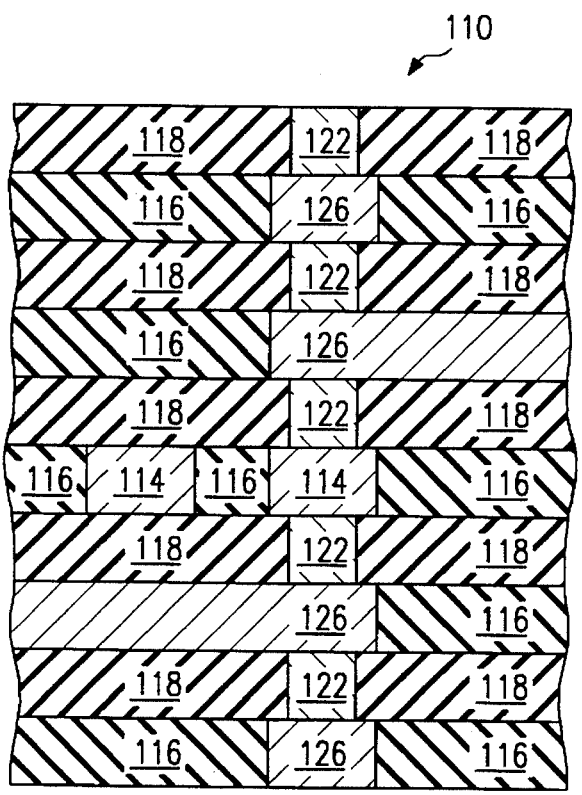
FIG. 8 is a cross-sectional elevational view of a fourth embodiment, in which the vertical heat conduction path extends throughout the entire wafer.

A fourth embodiment is shown in FIG. 8. Multiple layers of dummy vias 122+134 and dummy leads 126 are formed in contact with both the tops and bottoms of metal lead 114+130, creating a vertical dummy metal path for Joule's heat conduction. (For clarity, first barrier portions 130 of metal leads and second barrier portions 134 of dummy vias are not shown in FIG. 8. Preferably, the sides and bottom of dummy vias contain second barrier portion 134). This vertical dummy metal path may extend throughout the entire semiconductor wafer, and may terminate at the surface of the wafer to a contact pad which may be connected to other means of heat conduction. This embodiment is especially useful as it can be relatively easily added after thermal problems are uncovered during, e.g., pre-production testing.

Figure 9:
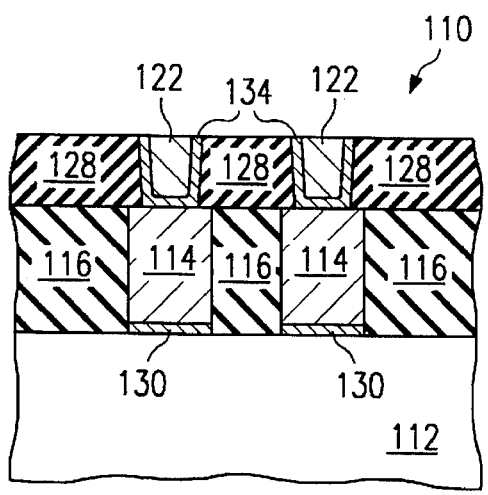
FIG. 9 is a cross-sectional elevational view of a fifth embodiment, which shows the use of a thermoconductive insulating layer.

A fifth embodiment of the present invention is shown in FIG. 9. After the step shown in FIG. 2C of the first embodiment, thermoconductive insulating layer 128, comprised of AlN, for example, is deposited over the tops of metal leads 114+130 and low dielectric constant material 116. The thermoconductive insulating layer 128 is patterned and etched to leave channels. A second barrier layer is deposited over the tops of metal leads 114+130 and thermoconductive insulating layer 128. A metal layer is deposited over second barrier layer (as was shown in FIG. 3A). The second barrier layer and metal layer fill the channels to form dummy vias 122+134 in thermoconductive insulating layer 128, in contact with metal leads 114+130, shown in FIG. 9. (Refer to U.S. patent application Ser. No. 08/251,822 filed on May 31, 1994 by Numata for Improving Reliability of Metal Leads in High Speed LSI Semiconductors Using Thermoconductive Dielectric Layer). Joule's heat from metal leads 114+130 is transferred to dummy vias 122+134 and then to thermoconductive insulating layer 128, improving the thermoconductivity of the structure, and thus improving the reliability of the metal leads. Subsequent processing steps as described in other embodiments may then be performed.

Figure 10C:
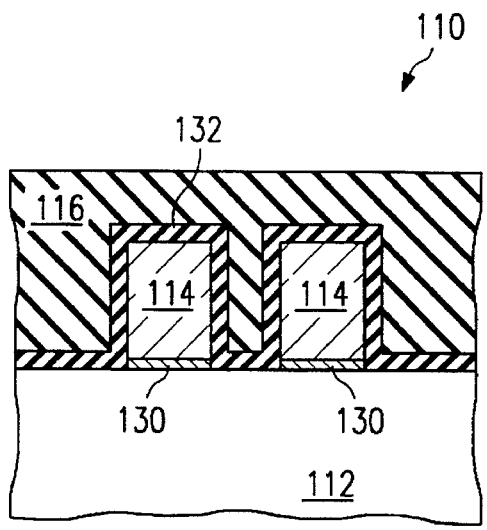
FIGS. 10A–10D and 11A–11C are cross-sectional elevational views of a sixth embodiment.
Figure 10A:
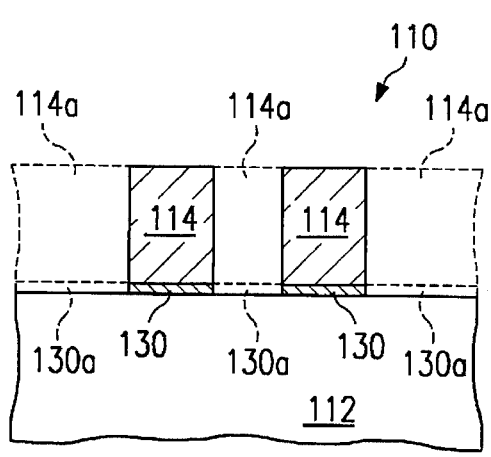

A sixth embodiment is shown in FIGS. 10A–10D and 11A–11C. In this embodiment, first barrier layer 130a, e.g., comprised of titanium, is deposited over the substrate 112 (FIG. 10A). A first metal interconnect layer 114a is deposited over the first barrier layer 130a. Preferably, the first metal interconnect layer 114a is comprised of a trilayer of TiN/AlCu/TiN. The trilayer is formed by first depositing titanium nitride over the first barrier layer using a CVD (chemical vapor deposition) process. Second, AlCu is deposited on the titanium nitride using a sputter process; and third, titanium nitride is deposited over the AlCu with a CVD process.

Figure 10D:
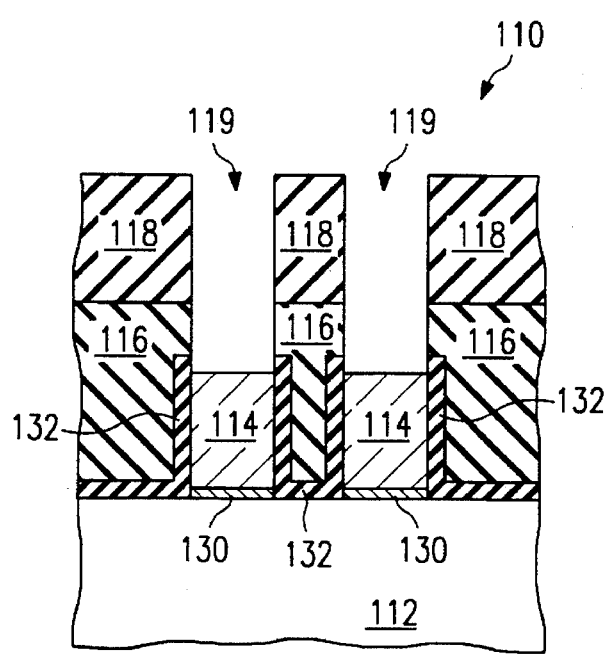
Figure 10B:
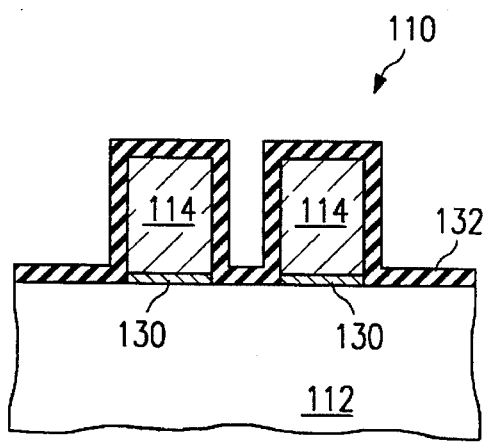
Figure 11A:
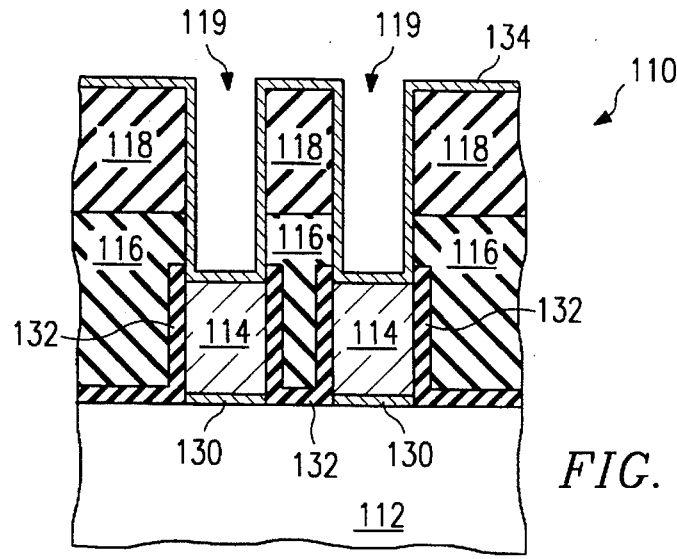
Figure 11B:
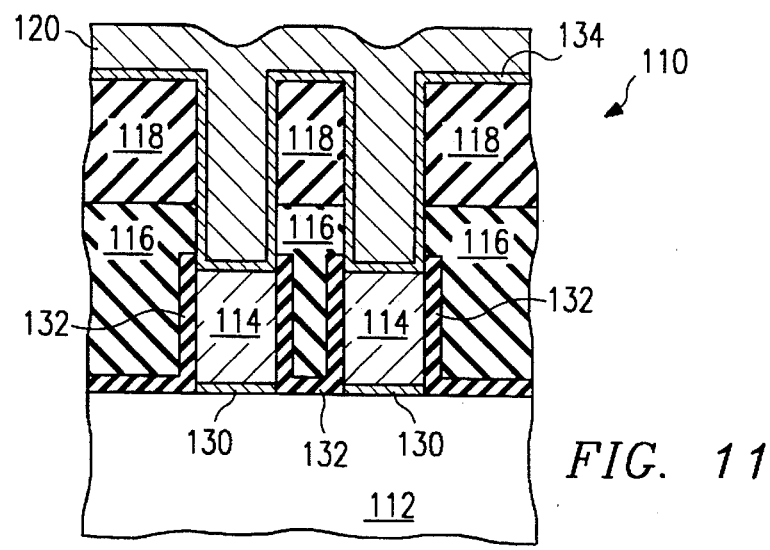
Figure 11C:
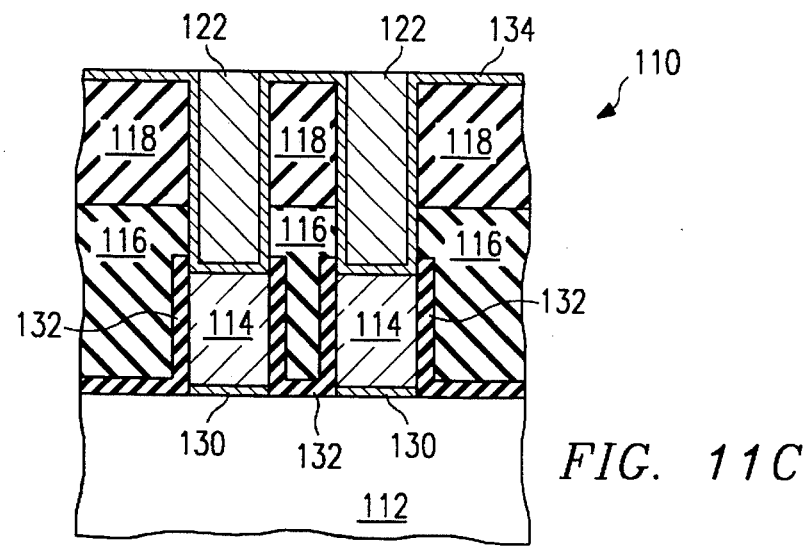

Next, metal leads 114+130 are formed by selective removal of portions of the first metal interconnect layer 114a and the first barrier layer 130a (as shown in phantom), leaving portions of the substrate 112 exposed (FIG. 10A). Each metal lead 114+130 includes a first metal interconnect portion 114 and a first barrier portion 130. A thin insulating layer 132, for example, TEOS silicon dioxide, is deposited over metal leads 114+130 and exposed portions of the substrate 112 (FIG. 10B). Low-dielectric constant material 116, preferably comprised of OSOG, is deposited over the thin insulating layer 132 (FIG. 10C) and may be planarized. Insulating layer 118, preferably TEOS silicon dioxide, is deposited over low-dielectric constant material 116. Insulating layer 118, low-dielectric constant material 116 and thin insulating layer 132 are patterned and etched to form channels 119 where dummy vias 122+134 will be formed (FIG. 10D). Second barrier layer 134 (preferably a bilayer of Ti/TiN, where the Ti is deposited first) is deposited over insulating layer 118, the tops of metal leads 114+130 and the exposed portions of low-dielectric constant material 116 (FIG. 11A). Metal layer 120 is deposited over second barrier layer 134 (FIG. 11B). Metal layer 120 fills channels 119 to form dummy vias 122+134. A top portion of metal layer 120 is removed, exposing portions of second barrier layer 134 residing on top of insulating layer 118, and forming dummy vias 122+134 (FIG. 11C). Each dummy via 122+134 includes a metal layer portion 122 and a second barrier portion 134. Portions of second barrier layer 134 residing on top of insulating layer 118 are left intact until the next metal interconnect layer is deposited, so that the second barrier layer 134 acts as a thin metal barrier for both the dummy vias 122+134 as well as subsequently-formed functional metal leads 124+134 (for example, as shown in FIG. 7).

An advantage of dummy vias 122+134 is their ability to create a vertical path of heat conduction in a semiconductor circuit. This is beneficial to scaled-down circuits where real estate in the horizontal direction is scarce.

An advantage of the present invention over using only dummy leads (as in U.S. patent application Ser. No. 08/250, 983 by Numata) is that in some circuits, them may not be room to form dummy leads proximate to metal leads. Also, the dummy leads, although proximate the metal leads, have a dielectric material residing between the dummy leads and the metal leads: thus, dummy vias, which have a metal-to-metal contact to the metal leads, are superior in conducting away the Joule's heat from the metal leads.

An advantage of the present invention over using only a thermoconductive insulating layer to conduct away some of the Joule's heat (as in U.S. patent application Ser. No. 08/251,822 by Numata) is that no additional steps are required to produce the dummy vias 122+134. Typically, functional vias are made between metal layers of an integrated circuit, and the dummy vias can be formed when the functional vias are formed.

The present invention can also be used on semiconductors using other low-dielectric constant materials, such as air gaps, acrogels, xerogels, or fluorinated silicon oxide, for example. To reduce capacitive coupling between adjacent leads, low-dielectric constant materials are being investigated, such as pure polymers (e.g., parylene, teflon, polyimide) or organic spin-on glass (OSOG, e.g., silsequioxane or siloxane glass). Refer to U.S. Pat. No. 4,987,101 issued to Kaanta et al. on Jan. 22, 1991 which describes a method for fabricating gas (air) dielectrics; and U.S. Pat. No. 5,103,288 issued to Sakamoto on Apr. 7, 1992 which describes a multilayered wiring structure which decreases capacitance by using a porous dielectric.

The novel structure and method involving the use of dummy vias 122+134 to conduct away Joule's heat from metal leads is particularly beneficial to very compact circuits having no room for dummy leads in the same metal interconnect, or in adjacent metal interconnect layers. The present invention is also beneficial to semiconductors having submicron spacing and using low-dielectric constant materials. The dummy vias 122+134 conduct away a portion of the Joule's heat generated in the metal leads, enhancing reliability of metal leads. The invention is particularly beneficial to semiconductors having a combination of metal leads with high aspect ratios (e.g., 2 or greater) and low-dielectric constant materials (especially having a low-dielectric constant of less than 2) which are more thermally insulating.

While the invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments. For example, although the effects of materials having dielectric constants of about 2.5 and concomitant low thermal conductivities are ameliorated by the present invention, the dummy vias 122+134 hereof are obviously useful to counteract the effects of any inter-lead dielectric material, the use of which may result in heat damage to the leads due to its low thermoconductivity.

What is claimed is:

1. A semiconductor device having metal leads with improved reliability, comprising:

a substrate;

at least two metal leads on said substrate;

a first insulating layer comprising a low-dielectric constant material between said metal leads, said low-dielectric constant material having a dielectric constant of less than about 3.5;

a second insulating layer in contact with at least said first insulating layer;

first dummy vias formed within said second inflating layer in contact with said metal leads, wherein heat from said metal leads is transferable to said first dummy vias, and wherein said first dummy vias are capable of conducting said heat away from said metal leads;

first dummy leads in contact with said first dummy vias, wherein heat from said metal leads is transferable to said first dummy leads, and wherein said first dummy leads are capable of conducting said heat away from said metal leads; and second dummy vias in contact with said first dummy leads, wherein heat from said metal leads is transferable to said second dummy leads, and wherein said second dummy vias are capable of conducting said heat away from said metal leads;

wherein said second insulating layer is comprised of a thermoconductive material comprising AlN, $Si_3N_4$, or both.

* * * * *